United States Patent [19]

Minato

[11] Patent Number: 5,510,274
[45] Date of Patent: Apr. 23, 1996

[54] METHOD OF CONTROLLING A CARRIER LIFETIME IN A SEMICONDUCTOR SWITCHING DEVICE

[75] Inventor: Tadaharu Minato, Itami, Japan

[73] Assignee: Mitsubishi Denki Kabushiki Kaisha, Tokyo, Japan

[21] Appl. No.: 355,806

[22] Filed: Dec. 14, 1994

Related U.S. Application Data

[63] Continuation of Ser. No. 59,357, May 11, 1993, abandoned, which is a continuation-in-part of Ser. No. 905,871, Jun. 29, 1992, abandoned, which is a division of Ser. No. 233,823, Aug. 10, 1988, Pat. No. 5,144,402.

[30] Foreign Application Priority Data

Aug. 19, 1987 [JP] Japan ................ 62-206856

[51] Int. Cl.⁶ .................................................. H01L 49/00
[52] U.S. Cl. ................ 437/6; 437/24; 437/173; 437/929; 437/938
[58] Field of Search .............................. 437/929, 938, 437/24, 6

[56] References Cited

U.S. PATENT DOCUMENTS

| | | | |
|---|---|---|---|
| 3,918,996 | 11/1975 | Morgan | 148/1.5 |
| 4,056,408 | 11/1977 | Bartko et al. | 148/1.5 |
| 4,278,475 | 7/1981 | Bartko et al. | 148/1.5 |
| 4,318,750 | 3/1982 | Rai-Choudhuri et al. | 148/1.5 |
| 4,497,109 | 2/1985 | Huber et al. | 29/578 |
| 4,521,256 | 6/1985 | Hiraki et al. | 148/1.5 |
| 4,585,489 | 4/1986 | Hiraki et al. | 148/1.5 |
| 4,622,573 | 11/1986 | Bakeman, Jr. et al. | 357/42 |
| 4,656,493 | 4/1987 | Adler et al. | 357/23.4 |
| 4,710,477 | 12/1987 | Chen | 437/34 |
| 4,710,792 | 12/1987 | Suzuki | 357/38 |
| 4,987,087 | 1/1991 | Voss | 437/6 |
| 5,049,965 | 9/1991 | Schulze et al. | 357/38 |
| 5,243,205 | 9/1993 | Kitagawa | 257/173 |

FOREIGN PATENT DOCUMENTS

| | | |
|---|---|---|
| 3151138 | 7/1982 | Germany . |
| 59-217366 | 12/1984 | Japan . |
| 61-202465 | 9/1986 | Japan . |

OTHER PUBLICATIONS

Przybysz, J. "Laser trimming of thyristor to add an over-voltage self-protected turn-on feature", IEEE, 1985, pp. 463–468.

*Primary Examiner*—Mary Wilczewski
*Assistant Examiner*—H. Jey Tsai
*Attorney, Agent, or Firm*—Oblon, Spivak, McClelland, Maier & Neustadt

[57] ABSTRACT

A semiconductor layer, through which a main current flows, is so structured that a carrier life time in the semiconductor layer is ununiform in accordance with a predetermined distribution of the carrier life time. Thus, turn OFF characteristics of a semiconductor switching device can be improved without causing any unacceptable disadvantages for other characteristics.

10 Claims, 4 Drawing Sheets

METHOD OF CONTROLLING A CARRIER LIFETIME IN A SEMICONDUCTOR SWITCHING DEVICE

This application is a Continuation of application Ser. No. 08/059,357, filed on May 11, 1993, now abandoned which is a continuation in part of Ser. No. 07/905,871 filed Jun. 29, 1992 now abandoned which is a divisional of 07/233,823 filed on Aug. 10, 1988 now U.S. Pat. No. 5,144,402.

BACKGROUND OF THE INVENTION

1. Field of the Invention

The present invention relates to a semiconductor switching device such as a thyristor and a method of controlling a carrier life time in a semiconductor switching device.

2. Description of the Background Art

It is known in the art to control a carrier life time in a semiconductor switching device by irradiating the semiconductor switching device with a radiation, such as an electron beam, a proton beam, alpha rays and gamma rays, to cause radiation defects, or lattice defects in wide sense. An example, in which a buried gate type static induction thyristor (hereinafter referred to as an SI thyristor) is irradiated with a radiation, will be described.

FIG. 1 is a cross-sectional view schematically showing the main portion of a structure of a conventional SI thyristor which has radiation defects caused by irradiation with a radiation. FIG. 2 is a view showing a process of irradiating an SI thyristor with a radiation.

Referring to FIG. 1, the SI thyristor comprises an N type semiconductor substrate 1, an anode region 2 which is formed on the back surface of the semiconductor substrate 1 by diffusing P type impurities, a cathode region 3 which is formed on the top surface of a jut of the semiconductor substrate 1 by diffusing N type impurities, and gate regions 4 which are formed on step portions of the semiconductor substrate 1 by diffusing P type impurities. A main current 9 flows through a channel region 5, which is surrounded by the gate regions 4.

This SI thyristor is irradiated with a radiation 10 such as an electron beam to cause radiation defects 7 in the semiconductor substrate 1, as shown in FIG. 2. The radiation defects 7 are uniformly distributed all over the irradiated portion of the semiconductor substrate 1, since the radiation defects 7 are caused by the interaction of the radiation 10 and atoms forming the semiconductor substrate 1. In FIG. 1 and FIG. 2, however, the radiation defects 7 are shown by only some cross marks for the convenience of illustration.

The operation of the SI thyristor, in the condition that a carrier life time is uniformly decreased all over the semiconductor substrate 1 due to the radiation defects 7, will now be roughly described. In an ON state, the main current 9 flows from the anode region 2 to the cathode region 3 through the channel region 5 against the interruption of the radiation defects 7, while many carriers 8 are trapped by the radiation defects 7. At the moment of a turn OFF of the SI thyristor, a number of carriers remain in the semiconductor substrate 1. If the life time of the carriers is long, the substantial turn OFF time of the SI thyristor becomes long. However, the SI thyristor shown in FIG. 1 has a number of radiation defects 7 which serve as a life time killer to the carriers, and hence the turn OFF time of the SI thyristor is decreased in the form of the decrease of a tail current. Thus, the switching loss of the SI thyristor in a turn OFF transition is greatly decreased by irradiating the SI thyristor with the radiation 10 to control a carrier life time.

However, such uniform irradiation of the semiconductor substrate 1 with the radiation 10 causes a number of radiation defects 7 in the channel region 5 through which the main current 9 flows, so that the forward voltage of the SI thyristor in an ON state is disadvantageously increased, mainly due to the decrease of a carrier life time in the channel region 5. The increase of the forward voltage results in the increase of a power loss in an ON state. Especially in a high breakdown voltage device such as a device having a higher breakdown voltage than 1500 V, such increase of the forward voltage causes unacceptable ON state power loss and exothermic device destruction, since such a device generally has a substrate having a high specific resistance.

Further, at the initial stage of a turn ON transition, carriers must progress against the radiation defects 7, in other words, the main current 9 must flow in the substrate 1 having a specific resistance increased by the radiation defects 7, and hence the turn ON time of the SI thyristor is increased.

If the SI thyristor is uniformly irradiated with a lot of radiation 10 to perform a strong life time control, a leak current in an OFF state is increased due to the occurrence of defects in a passivation film (not shown) and/or the deterioration of a surface condition of the substrate 1, and a main breakdown voltage is decreased due to the increase of a leak current at the exposed edges of P–N junctions defined by the substrate 1 and the gate regions 4.

In a MOS type transistor, such as MOSFET, other than a bipolar type high breakdown voltage switching device such as an Insulated Gate Bipolar Transistor (hereinafter referred to as an IGBT), a gate portion includes an insulator such as a silicon oxide film. Therefore, if the MOS type transistor is irradiated with a radiation to control a carrier life time, various surface states, which are induced in the gate portion, make controlling through a gate difficult, in addition to the problems as hereinbefore described.

Thus, the life time control of a semiconductor switching device by the irradiation of a radiation such as an electron beam has the advantage of decrease of a turn OFF time and the disadvantages of increase of a turn ON time as well as a forward voltage, and in some cases decrease of a breakdown voltage. The advantage and disadvantages are in a trade-off relationship, so it is difficult to appropriately accommodate the trade-off relationship for particular use of the semiconductor switching device.

A method of partly recovering deteriorated characteristics is conventionally widely, used, wherein a semiconductor switching device irradiated with a radiation is subjected to an annealing process to recover a crystal structure. Through the annealing process, the deteriorated characteristics are uniformly recovered, since a whole semiconductor switching device is only put into an uniformly high temperature condition in the anneal processing. Therefore, this annealing process is equivalent to work for selecting optimum quantity of irradiation of a radiation to implement a device having desired characteristics, and hence the problems as hereinbefore described can not be solved in essence through the annealing process.

SUMMARY OF THE INVENTION

According to the first aspect of the present invention, a semiconductor switching device has a semiconductor layer through which a main current flows. This semiconductor layer is so structured that a carrier life time in the semiconductor layer is ununiform in accordance with a predetermined distribution of the carrier life time.

According to the second aspect of the present invention, a method of controlling a carrier life time in a semiconductor switching device, having a semiconductor layer through which a main current flows, comprises the steps of preparing a semiconductor switching device and a radiation source for emitting a radiation, and irradiating the semiconductor switching device with the radiation emitted from the radiation source to cause radiation defects distributed in the semiconductor layer, in predetermined space and density distributions of the radiation defects.

Accordingly, it is an object of the present invention to provide a semiconductor switching device and a method of controlling a carrier life time in a semiconductor switching device, in which turn OFF characteristics of a semiconductor switching device can be improved without causing any unacceptable disadvantages for other characteristics.

These and other objects, features, aspects and advantages of the present invention will become more apparent from the following detailed description of the present invention when taken in conjunction with the accompanying drawings.

DETAILED DESCRIPTION OF THE INVENTION

Figure 1:
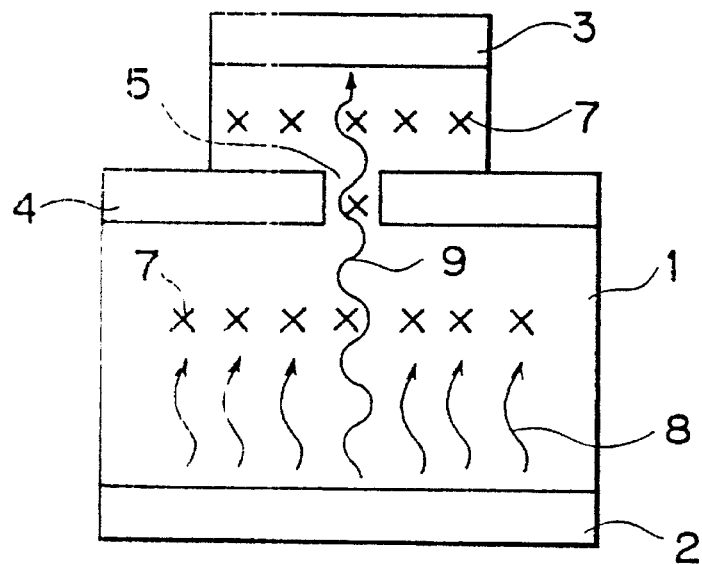
FIG. 1 is a cross-sectional view schematically showing the main portion of a structure of a conventional SI thyristor which has radiation defects caused by irradiation with a radiation.
Figure 2:
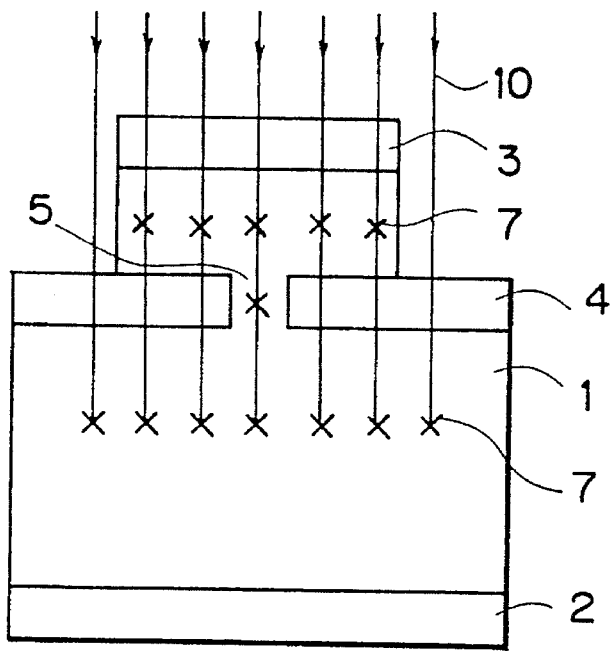
FIG. 2 is a view showing a process of irradiating an SI thyristor with a radiation.
Figure 3:
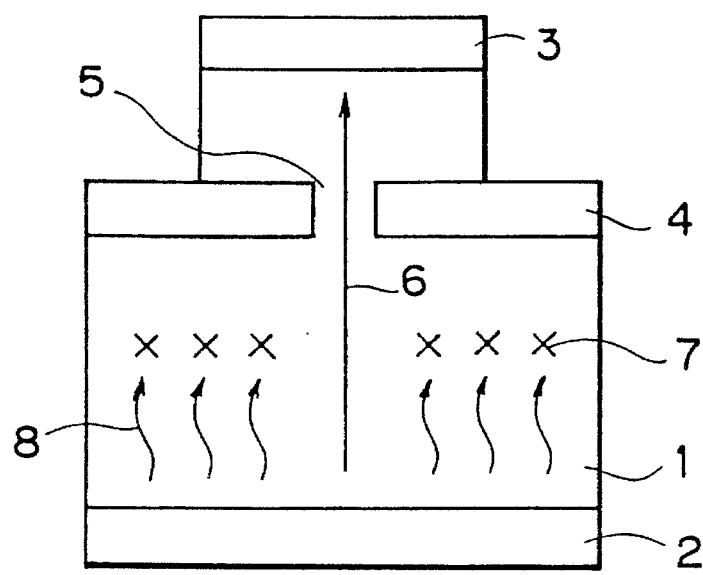
FIG. 3 is a cross-sectional view schematically showing the main portion of a structure of an SI thyristor according to an embodiment of the present invention.

FIG. 3 is a cross-sectional view schematically showing the main portion of a structure of an SI thyristor according to an embodiment of a semiconductor switching device in accordance with the present invention. Referring to FIG. 3, this SI thyristor has an N type semiconductor substrate 1. An anode region 2 is formed on the back surface of the semiconductor substrate I by diffusing P type impurities. A cathode region 3 is formed on the top surface of a jut of the semiconductor substrate 1 by diffusing N type impurities. Gate regions 4 are formed on step portions of the semiconductor substrate 1 by diffusing P type impurities. A channel region 5, through which a main current 6 flows, is surrounded by the gate regions 4.

Figure 4:
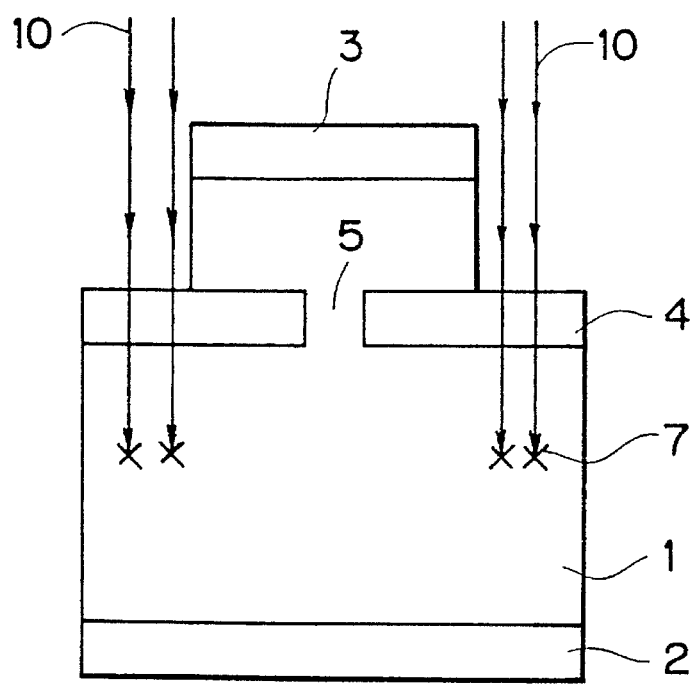
FIG. 4 is a view showing an example of the irradiation of an SI thyristor with a radiation in accordance with the present invention.

This SI thyristor is irradiated with a radiation 10 such as an electron beam, Proton (H+), Neutron Beam, Helium Beam, Ion Beam (where the Ion is Na, K, Ca, Ga, B, P, As, Sb, Ar, Ne, F, C, Si, Ge, a heavy metal Au, Ag, Fe, Cr and their complexes, or the like) or combination thereof to cause radiation defects 7, such as lattice or point defects, dislocations, dislocation loop, slip, stress or strain, precipitate, vacancy or any other life time killers or combinations thereof. In desired FIG. 4 is a view portions of the semiconductor substrate 1. The radiation source may be an electrostatic accelerator (e.g., ion injector, electron microscope, Van de Graaff accelerator) linear accelerator (linear) or cyclotron for example. FIG. 4 is a view showing an example of the irradiation of the SI thyristor with the radiation 10 in accordance with the present invention. Referring to FIG. 4, the SI thyristor is selectively irradiated with the radiation 10. As a result, the radiation defects 7 are densely and uniformly caused only in the irradiated portions, i.e., peripheral portions of the semiconductor substrate 1. In FIG. 3 and FIG. 4, the radiation defects 7 are shown by only some cross marks for the convenience of illustration.

In an ON state, the main current 6 flows from the anode region 2 to the cathode region 3 through the channel region 5 without being interrupted by the radiation defects 7 in the central portion of the substrate 1, while some carriers 8 are trapped by the lattice defects 7. Thus, the forward voltage of the SI thyristor is not so increased in spite of the presence of the lattice defects 7. It is generally known in this art that a main current path exhibits a 45° expansion. Hence, in the preferred embodiment, the carrier life time of at least a portion of the main current path in the substrate 1 becomes different from the carrier life time of the other portion in the substrate 1.

At the moment of a turn OFF of the SI thyristor, a number of carriers remain in the semiconductor substrate 1. The radiation defects 7 serve as a life time killer, so that the life time of the carriers decreased. Thus, the turn OFF time of the SI thyristor is sufficiently decreased in the form of the decrease of a tail current, as is similar to the conventional SI thyristor hereinbefore described.

At the initial stage of a turn ON transition, carriers can progress without being interrupted by the radiation defects 7 in the central portion of the substrate 1. Thus, the turn ON time of the SI thyristor is not so increased in spite of the presence of the radiation defects 7.

Even if the SI thyristor is irradiated with a lot of radiation 10 to perform a strong life time control, damages due to the much radiation are only partially caused because of the selective irradiation. That is, the occurrence of defects in a passivation film (not shown) and the deterioration of a surface condition of the substrate 1 are limited to be partial, and hence a leak current in an OFF state is not so increased. Further, in a MOS type transistor, if the irradiation of the MOS type transistor with a radiation is performed exclusive of a gate portion having an insulation film, it can not be caused that various surface states are induced in the gate portion to make a control through a gate difficult.

Thus, according to the embodiment, turn OFF characteristics of a semiconductor switching device can be improved without causing any disadvantages, such as unacceptable increase of a turn ON time and a forward voltage.

Figure 5:
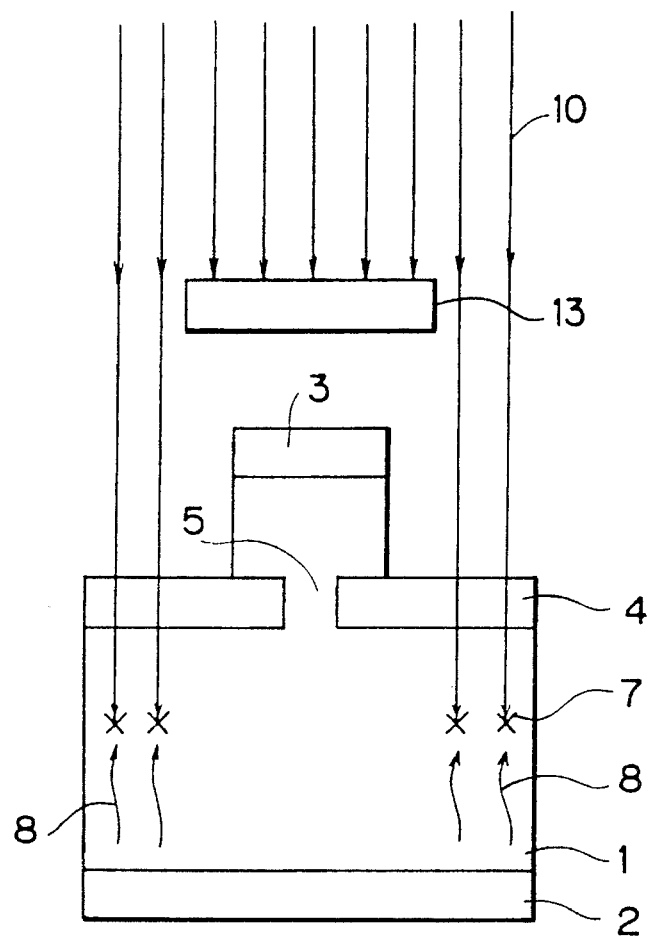
FIG. 5 and FIG. 6 are views showing examples of a structure for irradiating an SI thyristor with a radiation.
Figure 6:
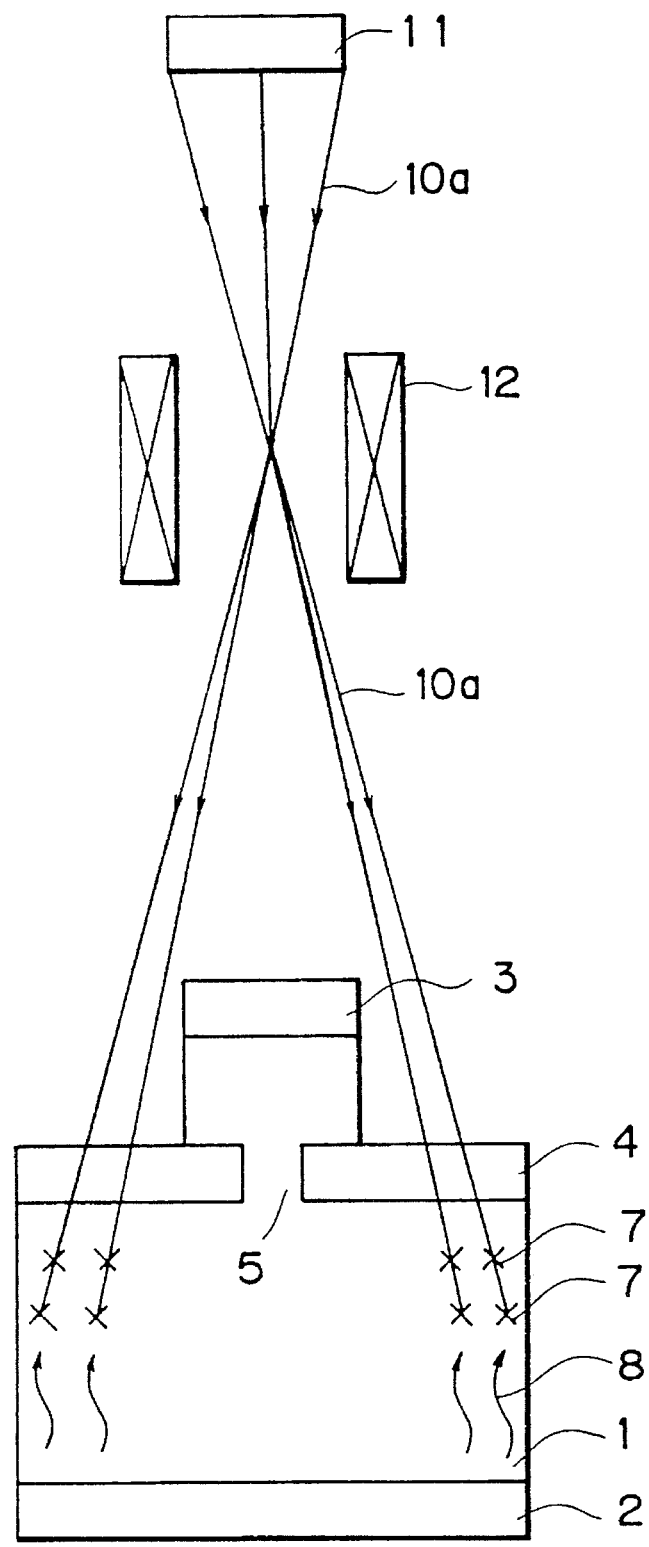

FIG. 5 and FIG. 6 are views showing examples of a structure for irradiating an SI thyristor with a radiation. Referring to FIG. 5, a shading plate 13 is placed above an SI thyristor so that a radiation 10 proceeding to the central portion of the SI thyristor is blocked. The following modes may be incorporation for the irradiating radiation:

1) both the shading plate and SI thyristor are fixed;
2) the SI thyristor is fixed and the shading plate is moved in the prescribed extent; or
3) the shading plate is fixed and the SI thyristor is moved in the prescribed extent. When radiation is irradiated, the radiation intensity may be changed with time. Because of the three modes of irradiation and the radiation intensity possible changing with time, it is possible to make the life time killer, which is incorporated in the SI thyristor, to have desired space and density distributions. Thus, the SI thyristor can be irradiated with the radiation 10 only in the peripheral portion thereof.

Referring to FIG. 6, a radiation source 11 and an electromagnetic lens 12 are placed above an SI thyristor. The radiation source 11 emits a charged particle beam 10a which is scanned by the electromagnetic lens 12 to irradiate the desired portion of the SI thyristor. When the beam is irradiated the total radiation time for each of the fine portions may be distributed in a prescribed manner. When the beam is irradiated the beam intensity may also be changed with time. Because of the total radiation time for each of the fine portions be distributed or the beam intensity being changed, it is possible to make the life time killer, which is incorporated in the SI thyristor to have a desired space and density distribution. Thus, the SI thyristor can be irradiated with the charged particle beam 10a, which is a kind of radiation, only in the peripheral portion thereof. It should also be noted in FIG. 5 that a mask such as a metal mask may be formed directly on the SI thyristor in place of the shading plate. The mask has a predetermined thickness distribution and a transmittance rate of irradiation may be changed with portions. In this case, the mask may be formed over the entire surface of the SI thyristor.

Because of the potential of the shading plate being replaced with a metal mask and transmittance rate of radiation being changed with the portions, it is possible to make the life time killer, which is incorporated in the SI thyristor to have a desired space and density distribution.

Figure 7:
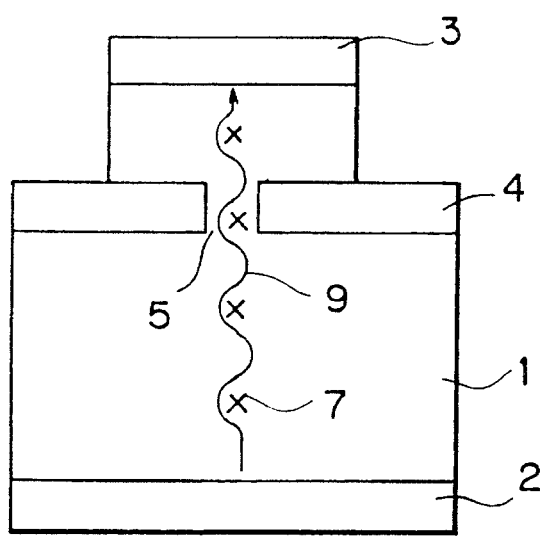
FIG. 7 is a cross-sectional view showing an SI thyristor according to another embodiment of the present invention.

FIG. 7 is a cross-sectional view showing an SI thyristor according to another embodiment of the semiconductor switching device in accordance with the present invention. Referring to FIG. 7, radiation defects 7 are cased only in the central portion of a semiconductor substrate 1. This SI thyristor is so structured that the increase of a turn ON time and a forward voltage, due to the radiation defects 7 distributed mainly in a main current path, is compensated by the portion of an anode region 2 not corresponding to the main current path. Namely, the impurity concentration of the anode region 2 is relatively high in the peripheral portion thereof to increase a carrier injection efficiency from the anode region 2 to the semiconductor substrate 1, to thereby decrease the turn ON time and the forward voltage. According to this embodiment, radiation defects 7 in a channel region 5 operate to shorten the life time of carriers in the channel region 5, to hasten the pinch-off of the channel region 5 in a turn OFF transition. In addition, radiation defects 7 in the semiconductor substrate 1 decrease a tail current in the turn OFF transition. Thus, the turn OFF time of this SI thyristor is much decreased. If the semiconductor substrate 1 is thick so that a distance between the peripheral portion of the anode region 2 and the channel region 5 is longer than the mean free path of carriers, carriers injected from the peripheral portion of the anode region 2 disappear before they reach the channel region 5 in the turn OFF transition, so that the turn OFF time is further decreased.

In general, the structure shown in FIG. 7 is effective to much decrease a turn OFF time, in the case that the increase of a turn ON time and a forward voltage due to the radiation defects 7 in the central portion of the substrate 1 is allowable. That is, if the SI thyristor shown in FIG. 7 has a wide anode region 2 of high impurity concentration, a carrier injection efficiency is increased. Further, if a breakdown voltage required for the SI thyristor is not so high, the specific resistance of the semiconductor substrate 1 may be low. In such a case, the SI thyristor is able to have a small turn ON time and forward voltage, so that a little increase of the turn ON time and forward voltage due to the radiation defects 7 is allowable.

Although the radiation defects 7 are densely and uniformly caused in the peripheral or central portion of the substrate 1 in the above embodiments, the lattice defects 7 may be caused in desired space and density distributions in the substrate 1 to implement an SI thyristor of desired characteristics. This can be achieved by making the thickness of the shading plate 13 shown in FIG. 5 uneven to vary a transmission factor of the radiation 10 in accordance with the desired space and density distributions of the radiation defects 7, or by making the scanning speed of the charged particle beam 10a shown in FIG. 6 uneven in order to vary the irradiation time of the charged particle beam 10a in accordance with the desired space and density distributions of the radiation defects 7. Further, a plurality of kinds of radiation defects may be caused in the semiconductor substrate 1 in respective desired space and density distributions to implement an SI thyristor of desired characteristics.

Although the embodiments according to the present invention have been described in detail with respect to an SI thyristor which is a sort of bipolar type device, the present invention is applicable not only to bipolar type devices but also to all semiconductor switching devices such as a MOS type device (e.g., vertical, lateral, horizontal type MOS transistors) and a diode, general thyristors, GTO thyristors, Si thyristors, MOS Gate GTo, MCt (MOS controlled thyristors) or other devices, such as general and power transistors, Insulated Gate Bipolar Transistors (IGBT) or other composite devices.

Although the present invention has been describe and illustrated in detail, it is clearly understood that the same is by way of illustration and example only and is not to be taken by way of limitation, the spirit and scope of the present invention being limited only by the terms of the appended claims.

What is claimed as new and desired to be secured by Letters Patent of the United States is:

1. A method of controlling a carrier life time in a semiconductor switching device having a cathode region and a gate region for switching a main current and a semiconductor layer through which said main current flows to the cathode region, comprising the steps of:

preparing a semiconductor switching device and a radiation source for emitting a radiation; and irradiating said semiconductor switching device with said irradiation emitted from said radiation source only at a peripheral portion of said semiconductor layer aligned with said gate region to cause lattice defects only at the irradiated peripheral portion so that a central main current flowing portion in said semiconductor layer is different in carrier life time from the irradiated peripheral portion in said semiconductor layer.

2. A method of controlling a carrier life time in a semiconductor switching device as in claim 1, further comprising the step of preparing a shading plate, wherein said step of irradiating includes the step of irradiating said semiconductor switching device with said radiation emitted from said radiation source through said shading plate.

3. A method of controlling a carrier life time in a semiconductor switching device as in claim 1, further comprising the step of preparing an electromagnetic lens for scanning a charged particle beam, wherein said step of irradiating includes the step of irradiating said semiconductor switching device with said charged particle beam emitted from said radiation source through said electromagnetic lens.

4. A method for controlling a carrier life time in a semiconductor switching device as in claim 1, wherein said irradiating step of irradiation is selected from the group consisting of radiation produced from an electron beam, a proton beam, a neutron beam, a helium beam, an ion beam and a combination thereof.

5. A method as in claim 1 wherein said defects produced are selected from the group consisting of lattice defects, point defects, dislocation, dislocations loops, slips, stresses, strains, precipitate vacancies and a combination thereof.

6. A method as in claim 1, wherein said irradiation is produced by one of the group of an electrostatic accelerator, an ion injector, an electron microscope, a Van de Graaff accelerator, a linac or a cyclotron.

7. A method as in claim 2, further comprising the step of:

fixing said shading plate and said semiconductor device relative to each other.

8. A method as in claim 2, further comprising the steps of:

fixing said semiconductor device; and moving said shading plate.

9. A method as in claim 2, further comprising the step of:

fixing said shading plate; and moving said semiconductor device.

10. A method as in claim 1, further comprising the step of forming a metal mask directly on said semiconductor switching device.

* * * * *